United States Patent
Thaler

[11] Patent Number: 5,472,546
[45] Date of Patent: Dec. 5, 1995

[54] METHOD FOR MAKING PRINTED CIRCUIT BOARDS

[76] Inventor: Hartmuth F. Thaler, Hohestrasse 20, Öhringen-Cappel, Germany, D-74613

[21] Appl. No.: 244,641
[22] PCT Filed: Aug. 14, 1993
[86] PCT No.: PCT/EP93/02167
  § 371 Date: May 27, 1994
  § 102(e) Date: May 27, 1994
[87] PCT Pub. No.: WO94/08441
  PCT Pub. Date: Apr. 14, 1994

[30] Foreign Application Priority Data

Sep. 29, 1992 [DE] Germany ............... 42 32 666.4

[51] Int. Cl.⁶ ..................... B32B 31/10; B32B 31/18
[52] U.S. Cl. ................. 156/256; 156/252; 156/265; 156/297; 29/17.2; 29/831
[58] Field of Search ..................... 156/256, 257, 156/89, 250, 264, 267, 297, 252, 265; 29/17.1, 17.2, 831

[56] References Cited

U.S. PATENT DOCUMENTS 2,508,030  5/1950  Karns .

FOREIGN PATENT DOCUMENTS 1211029   3/1960  France .
 478666   7/1929  Germany .
1226182  10/1966  Germany .

Primary Examiner—David A. Simmons
Assistant Examiner—M. Curtis Mayes
Attorney, Agent, or Firm—Antonelli, Terry, Stout & Kraus

[57] ABSTRACT

To make a printed circuit board, bores bridge gaps between where conductor paths are to be located, and are then filled with an adhesive. The gaps between where the conductor paths are to be located then caustically removed so that a conductor path skeleton results which is held together by the adhesive bridges. Finally, the conductor path skeleton is affixed to an insulating layer.

15 Claims, 4 Drawing Sheets

METHOD FOR MAKING PRINTED CIRCUIT BOARDS

FIELD OF THE INVENTION

The invention relates to a method for making printed circuit boards.

BACKGROUND TO THE INVENTION

Printed circuit boards are usually made by an etching method. A resin-impregnated insulating base, lined with a metal foil, is used. The desired conductor paths are covered by lacquer on the metal foil and those areas of the metal foil which are not covered are then caustically removed.

Printed circuit boards made in this way are relatively expensive. The base both insulates and constitutes a carrier for the conductor paths and is, therefore, usually made relatively thick. Generally, a phenolic resin is used to impregnate the insulating base. If several printed circuit boards are arranged one above the other, relatively thick and heavy packs result. It is of particular importance that printed circuit boards of this type must be treated as separate waste during disposal.

DE-PS 47 86 66 describes a method for making printed circuit boards by affixing conducting structures stamped out of sheet metal to an insulating base. In order to enable the stamped conductor paths to be held together, metal connecting straps are left between the conductor paths and are removed after the conducting structure has been fastened to the insulating base. Due to the fact that these connecting straps are removed, the mechanical stability of the printed circuit boards is determined solely by the insulating base, so that these must also be made relatively thick when using this method.

SUMMARY OF THE INVENTION

It is an object of the invention to provide a method such that inexpensive and thin insulating bases can be used.

In accordance with an embodiment of the invention, a method for making printed circuit boards comprised of a conductor pattern formed from a metal foil or sheet metal is comprised of the steps of inserting openings at predetermined locations of the metal foil or sheet metal in areas to be subsequently removed between conductor paths of the conductor pattern, filling the openings with adhesive, forming the conductor pattern by removing the metal foil or sheet in the areas while leaving connecting bridges comprised of the adhesive to mechanically stabilize the conductor pattern, and affixing the formed conductor pattern mechanically stabilized by the connecting bridges to an insulating base.

Embodiments of the invention are described in greater detail in the following with reference to the drawings, showing:

DETAILED DESCRIPTION OF THE INVENTION

Figure 1:
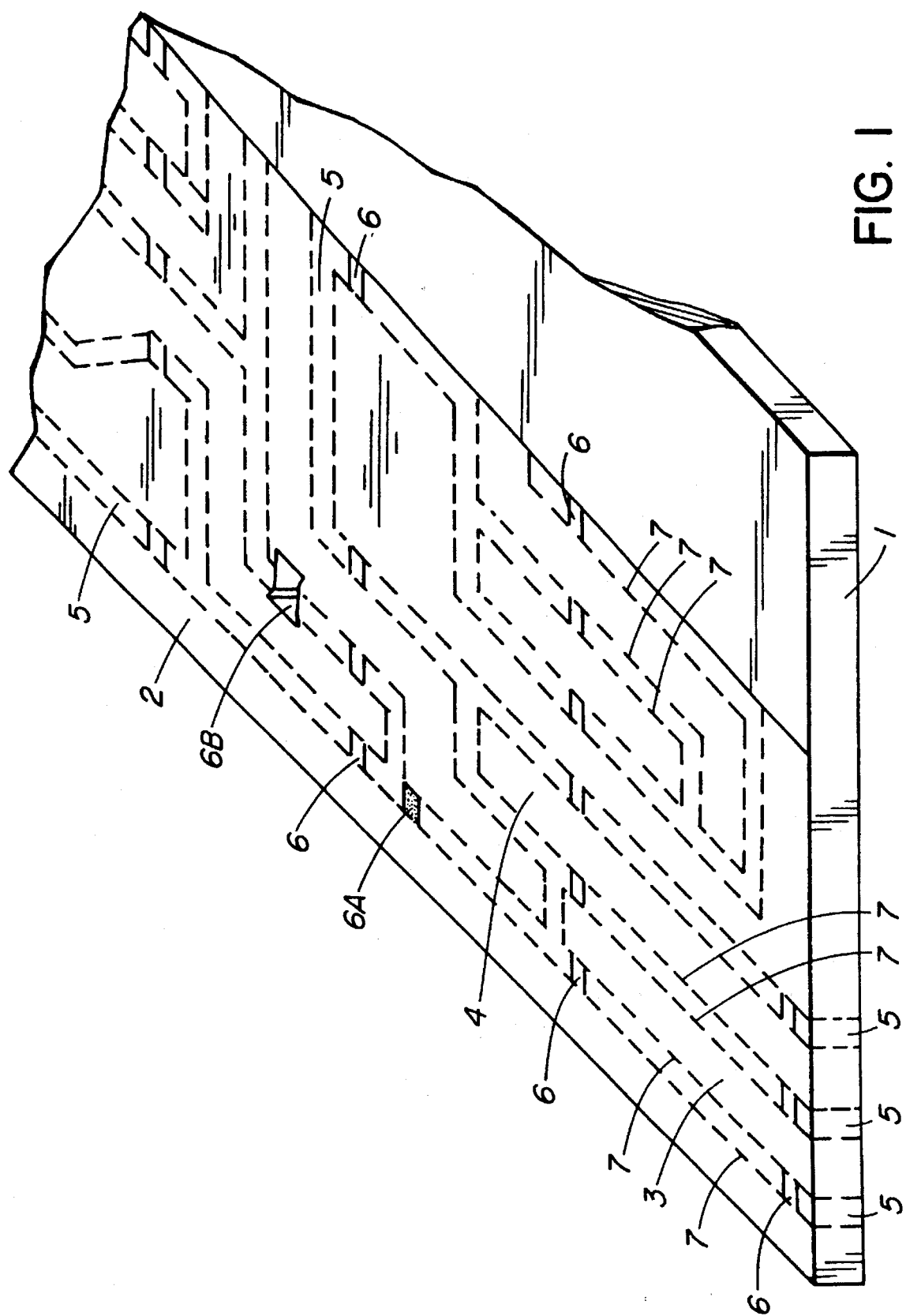
FIG. 1 is a perspective view of a metal foil to illustrate a first procedural step.

Metal foil or sheet metal 1 shown in of FIG. 1 is, for example, a copper foil having a thickness of 0.4 mm. Conductor paths to be made, such as, e.g. conductor paths 2, 3, 4, are shown by broken lines. The conductor paths 2, 3, 4 to be made are separated from one another by the areas 5 to be subsequently removed.

Recesses 6 are made at those points where these areas 5 are to be located. When openings 6 have a circular cross-section, these are produced by boring. However, rectangular stamped openings 6A are preferably provided. The sizes of these openings 6, 6A are such that they come in contact with the edges 7 of the conductor paths 2, 3, 4 which are to be subsequently made adjacent to one another.

Figure 2:
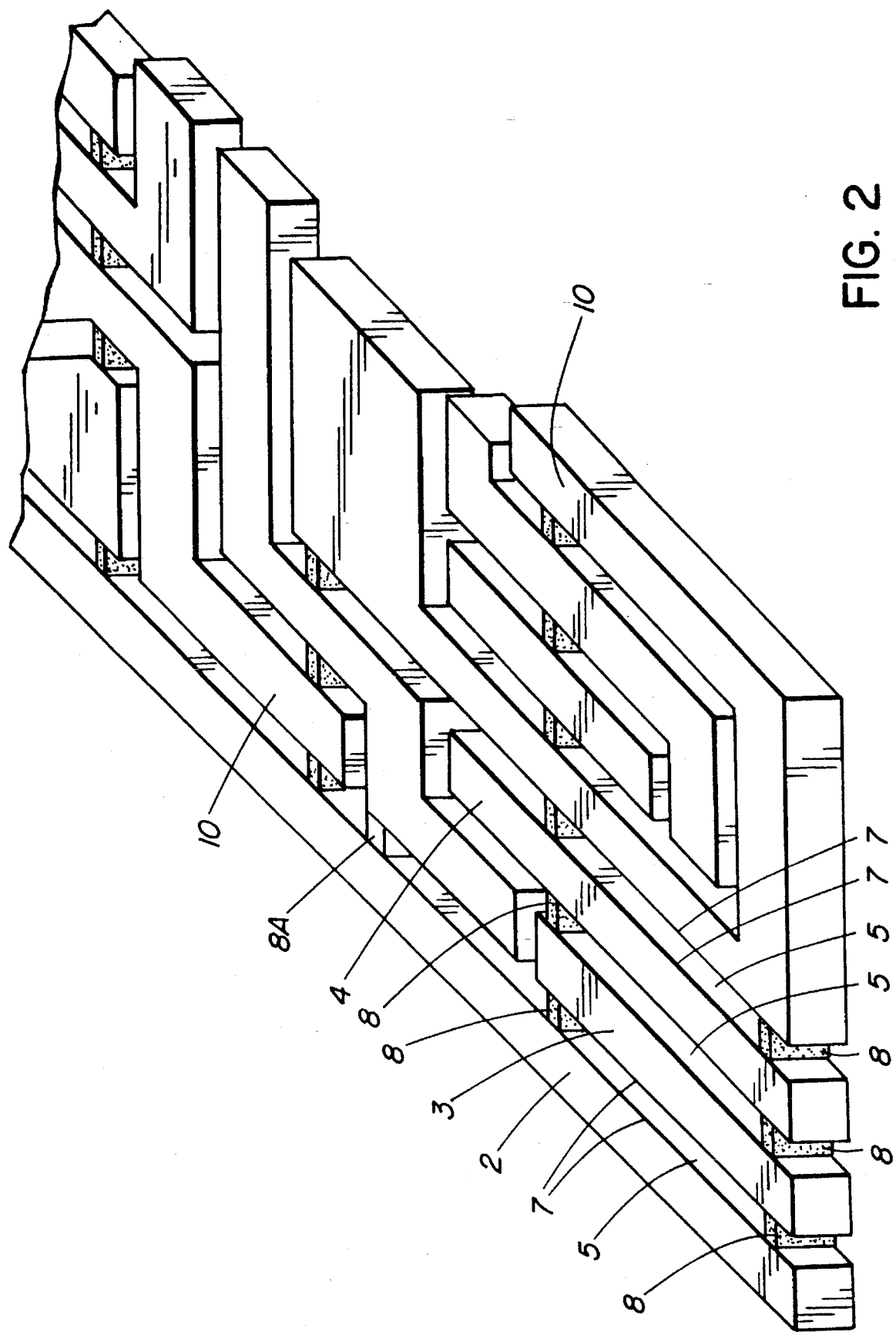
FIG. 2 is a perspective view of the conductor paths to illustrate a second and third procedural step.

In a next procedural step, openings 6, 6A are filled with an adhesive, resin or cement. After the adhesive or resin or cement has hardened, the conductor paths, e.g. conductor paths 2, 3, 4, are isolated by treating the metal areas 5, not required, between conductor paths. This isolation can, for example, be achieved by etching, that is, by covering the conductor paths and caustically removing areas 5. Connecting bridges 8, connecting the conductor paths 2, 3, 4 with one another and consisting of adhesive, resin or cement, are now located at those points at which bores 6, 6A were previously located, as may be seen in FIG. 2. Thus, for example, conductor path 2 and conductor path 3 are connected to one another via two connecting bridges 8 and conductor paths 3, 4 via two additional connecting bridges 8.

Areas 5 can also be produced by stumping, whereby care must be token that the connecting bridges 8 remain standing, that is, not stamped out.

Thus, a conductor pattern results which consists of individual conductor paths 2, 3, 4 in which adjacent conducting paths are connected to one another via connecting bridges 8.

Figure 3:
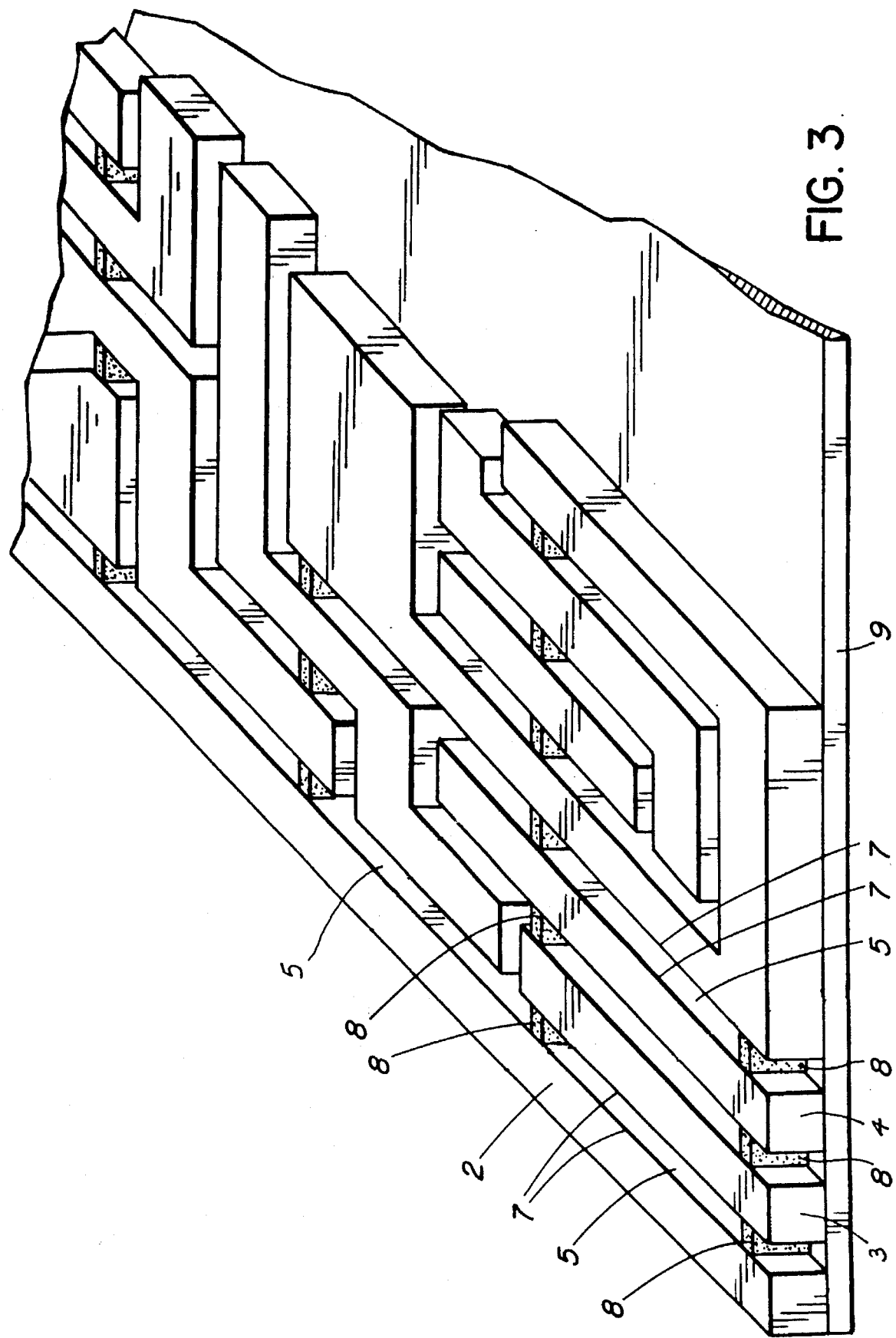
FIG. 3 is a perspective view of the printed circuit board to illustrate a fourth procedural step.

This conductor pattern, as shown in FIG. 3, is now placed on an insulating base 9. The individual conductor paths can now be fastened there by means of an adhesive. Preferably, the insulating base is a supporting adhesive foil having, for example, a thickness of 0.1 mm.

Preferably, rectangular openings 6A are provided, the walls of which extend longitudinally and diagonally to the conductor paths, whereby the longitudinal walls produce a larger contact area for the edges 7. The diagonal walls of these bores 6A then also facilitate the production of areas 5 by stamping.

The size of openings 6, 6A do not necessarily have to be equal to the width of area 5. It is also possible to make openings 6, 6A larger than the width of area 5 so that the connecting bridges 8 engage in adjacent conductor paths. In a case of this type, it is also possible to design the areas of the openings engaging in adjacent conductor paths with an undercut, as for example opening 6B in FIG. 1. The connecting bridge subsequently made is then interlocked with the adjacent conductor paths.

Figure 4:
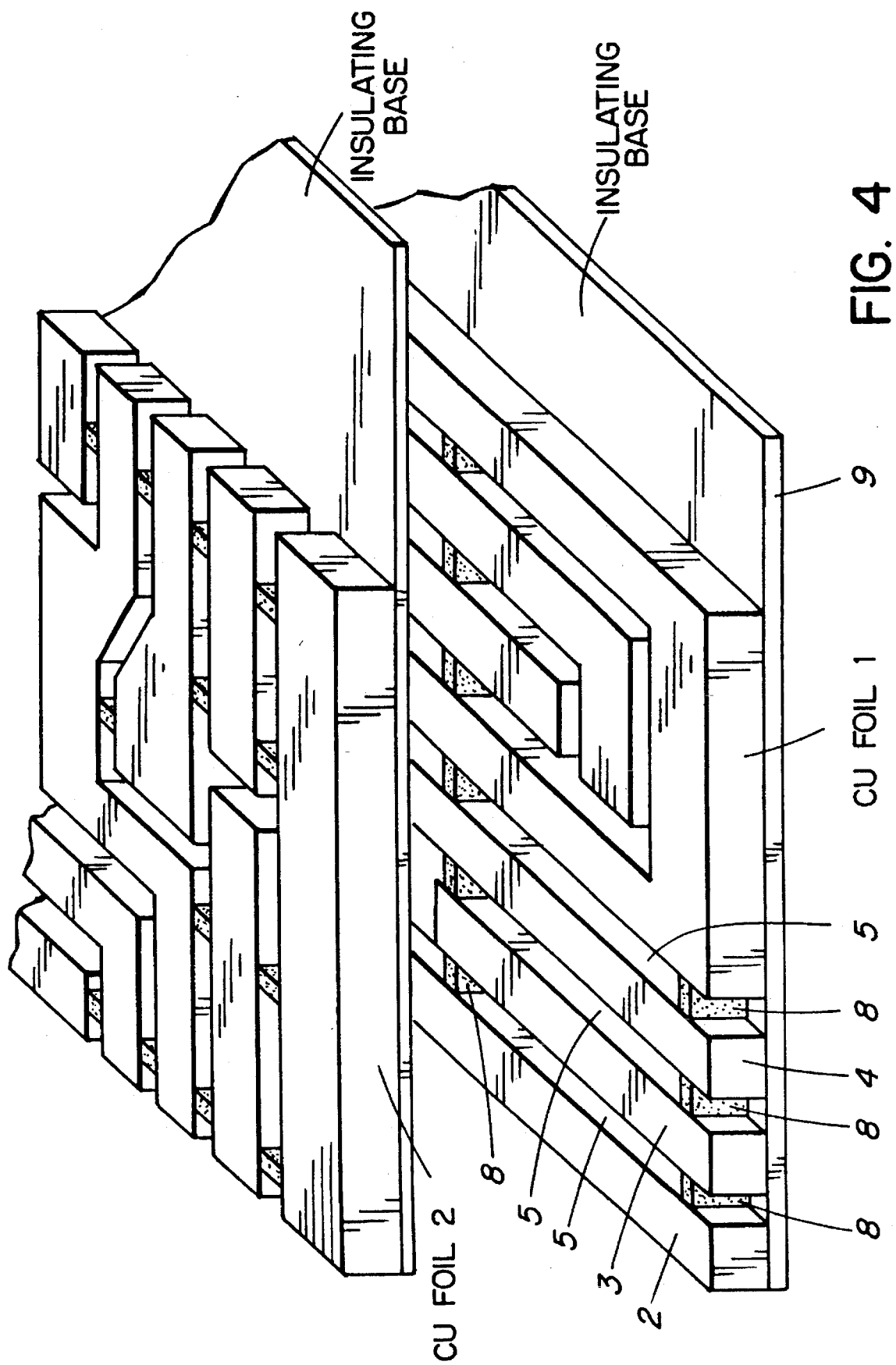
FIG. 4 is a perspective view of two printed circuit boards for making a multilayer printed circuit board.

To make a multilayer printed circuit board, the individual printed circuit boards are now placed on top of one another as shown in FIG. 4, whereby the individual layers are connected to one another by flexible pins. They are then equipped with sockets and/or blade contacts.

In order that the multilayer printed circuit board should have sufficient stability, it is mounted on a laminated paper or metal plate, in the latter case with an insulating foil as an intermediate layer.

In this way, a multilayer printed circuit board can be produced which has e.g., with a thickness of 6 mm, ten layers of printed circuit boards.

If a stamping method is used, it is possible to simultaneously stamp several metal foils or sheet metal layers 1 stacked on top of one another.

Openings 6, 6A are preferably each arranged in rows 10 which extend orthogonally to the main orientation of the conductor paths.

When making a multilayer printed circuit board, the individual printed circuit boards are arranged on top of one another, each preferably staggered by 90° to the main orientation of their conductor paths, as shown in FIG. 4. In the lower printed circuit board of FIG. 4, the conductor paths extend from the bottom to the top, whereas the main orientation of the conductor paths of the upper printed circuit board is from the right to the left.

I claim:

1. A method for making printed circuit boards comprised of a conductor pattern formed from a metal foil or sheet metal comprising the steps of:
   (a) inserting openings at predetermined locations in the metal foil or sheet metal in areas to be subsequently removed between conductor paths of the conductor pattern,
   (b) filling the openings with adhesive,
   (c) forming the conductor pattern by removing the metal foil or sheet in said areas while leaving connecting bridges comprised of said adhesive to mechanically stabilize the conductor pattern, and
   (d) affixing the formed conductor pattern mechanically stabilized by the connecting bridges to an insulating base.

2. A method as defined in claim 1, including arranging the openings in rows which extend orthogonally to the main orientation of the conductor paths.

3. A method as defined in claim 1, including producing said openings with circular cross-section.

4. A method as defined in claim 3, including producing said openings by boring.

5. A method as defined in claim 3, including producing said openings by stamping.

6. A method as defined in claim 1, including producing said openings with rectangular cross-section.

7. A method as defined in claim 6, including producing said openings by stamping.

8. A method as defined in claim 1, including forming said openings as areas with widths which are larger than the width of said areas to be removed.

9. A method as defined in claim 8, including forming said openings as areas that engage and undercut the conductor paths.

10. A method as defined in claim 1, including the steps of stacking several metal foils or sheet metal on top of one another, and simultaneously forming said openings in said several metal foils or sheet metal.

11. A method as defined in claim 1, including caustically removing said areas to form said conductive pattern.

12. A method as defined in claim 1, including by stamping but said areas with the exception of said connecting bridges, to form said conductive pattern.

13. A method as defined in claim 12, including stacking several metal foils or sheet metal on top of one another and simultaneously stamping out said metal areas to form said conductive patterns in each metal foil or sheet metal.

14. A method as defined in claim 1, including affixing the formed conductor pattern to the insulating base by means of an adhesive.

15. A method as defined in claim 14, including affixing the conductor pattern to a supporting adhesive foil.

* * * * *